(12) United States Patent
Lee et al.

(10) Patent No.: US 11,967,492 B2
(45) Date of Patent: Apr. 23, 2024

(54) THIN FILM MANUFACTURING APPARATUS

(71) Applicant: AP SYSTEMS INC., Hwaseong-Si (KR)

(72) Inventors: Byoung Il Lee, Osan-Si (KR); Chang Kyo Kim, Hwaseong-Si (KR); Chang Min Kwon, Osan-Si (KR); Seung Won Yu, Osan-Si (KR)

(73) Assignee: AP SYSTEMS INC. (KR)

(*) Notice: Subject to any disclaimer, the term of this patent is extended or adjusted under 35 U.S.C. 154(b) by 331 days.

(21) Appl. No.: 17/495,796

(22) Filed: Oct. 6, 2021

(65) Prior Publication Data

US 2022/0122824 A1 Apr. 21, 2022

(30) Foreign Application Priority Data

Oct. 20, 2020 (KR) .................... 10-2020-0136090

(51) Int. Cl.
*H01J 37/32* (2006.01)
*C23C 16/509* (2006.01)

(52) U.S. Cl.
CPC .... *H01J 37/32899* (2013.01); *C23C 16/5096* (2013.01); *H01J 37/3244* (2013.01); *H01J 37/32568* (2013.01)

(58) Field of Classification Search
None
See application file for complete search history.

(56) References Cited

U.S. PATENT DOCUMENTS

| 7,198,677 | B2 * | 4/2007 | Yoo | C23C 16/4584 |
| | | | | 156/345.23 |
| 8,282,768 | B1 * | 10/2012 | Smargiassi | H01L 21/6719 |
| | | | | 156/345.55 |
| 2004/0026037 | A1 * | 2/2004 | Shinriki | C23C 16/45578 |
| | | | | 438/785 |

(Continued)

FOREIGN PATENT DOCUMENTS

| JP | 2012256724 A | 12/2012 |
| KR | 910020816 A | 12/1991 |

(Continued)

OTHER PUBLICATIONS

Machine Generated English Translation of JP2012-256724. Published Dec. 27, 2012 (Year: 2012).*

*Primary Examiner* — Sylvia MacArthur
(74) *Attorney, Agent, or Firm* — Renaissance IP Law Group LLP

(57) ABSTRACT

The present disclosure relates to a thin film manufacturing apparatus including a chamber having an inner process space of a substrate, a substrate support unit connected to the chamber to support the substrate in the chamber, a heat source unit connected to the chamber and disposed opposite to the substrate support unit, a plasma generation unit connected to one side of the chamber to supply radicals between the substrate support unit and the heat source unit, and a baffle connected to the chamber and including a movement passage of the radicals therein and a plurality of first exhaust holes communicating with the movement passage, which are formed in a top surface thereof. The thin film manufacturing apparatus may improve uniformity of the thin film formed on the substrate.

16 Claims, 4 Drawing Sheets

(56) References Cited

U.S. PATENT DOCUMENTS

2018/0347045 A1* 12/2018 Olsen ................. C30B 25/14
2019/0348315 A1* 11/2019 Tanikawa ............. B08B 5/02
2022/0122824 A1* 4/2022 Lee ................ C23C 16/4412

FOREIGN PATENT DOCUMENTS

| KR | 19910020816 A | * 12/1991 |
| KR | 20030086951 A | 11/2003 |
| KR | 100531629 B1 | 11/2005 |
| KR | 20070033495 A | 3/2007 |
| KR | 100722016 B1 | 5/2007 |
| KR | 20200003426 A | 1/2020 |

* cited by examiner

100 : 110, 120, 130, 140
200 : 210, 220
300 : 310, 320, 330, 332, 340
400 : 410, 420, 430

THIN FILM MANUFACTURING APPARATUS

CROSS-REFERENCE TO RELATED APPLICATION

This application claims priority to Korean Patent Application No. 10-2020-0136090 filed on Oct. 20, 2020, and all the benefits accruing therefrom under 35 U.S.C. § 119, the contents of which are incorporated by reference in their entirety.

BACKGROUND

The present disclosure relates to a thin film manufacturing apparatus, and more particularly, to a thin film manufacturing apparatus capable of improving uniformity of a thin film.

In recent years, a rapid thermal processing (RTP) method is widely used as a method for thermally processing a substrate.

The RTP method thermally processes the substrate by irradiating the substrate with radiation light emitted from a heat source such as a tungsten lamp. This RTP method may rapidly heat or cool the substrate and easily control adjustment of a pressure condition or a temperature range to improve a thermal processing quality of the substrate in comparison with a typical substrate thermal processing method using a furnace.

A thin film manufacturing apparatus using the RTP method generally includes a chamber providing a space for processing the substrate, a substrate support for supporting the substrate in the chamber, a heat source for irradiating the substrate with radiation light, and a plasma generator for activating a process gas and supplying the process gas into the chamber. Here, the heat source and the substrate support are installed on upper and lower portions of the chamber, respectively, and the chamber has a process space having a short distance between the substrate and the heat source and a long and wide length in a horizontal direction to effectively heat the substrate. Since the plasma generator is difficult to be installed in the chamber, radicals are generated outside the chamber by using the plasma generator and then supplied into the chamber through a sidewall of the chamber when a thin film is manufactured.

However, since the inner process space of the chamber has the long and width length in the horizontal direction, the radicals may not be sufficiently diffused over the entire process space, and thus uniformity of the thin film may be degraded.

In order to resolve the above-described limitation, a method for locally adjusting a temperature of the substrate by using a heat source is used. In this case, however, the substrate may be deformed due to a thermal stress caused by a temperature deviation of the substrate, and productivity may be degraded.

SUMMARY

The present disclosure provides a thin film manufacturing apparatus capable of improving uniformity of a thin film.

In accordance with an exemplary embodiment, a thin film manufacturing apparatus includes: a chamber having an inner process space of a substrate; a substrate support unit connected to the chamber to support the substrate in the chamber; a heat source unit connected to the chamber and disposed opposite to the substrate support unit; a plasma generation unit connected to one side of the chamber to supply radicals between the substrate support unit and the heat source unit; and a baffle connected to the chamber and including a movement passage of the radicals therein and a plurality of first exhaust holes communicating with the movement passage, which are formed in a top surface thereof.

The chamber may provide the process space having a height less than each of a width and a thickness thereof, the chamber may include an injection hole formed at one side of the chamber to inject the radicals into the process space, and the baffle may be disposed at the other side of the chamber to extend in one direction.

The substrate support unit may include a substrate support that is rotatable and installed in the chamber, and the baffle may be connected to the chamber so that a top surface of the baffle is disposed at a position lower than a top surface of the substrate seated on the substrate support.

The plurality of first exhaust holes may be spaced apart from each other in a horizontal direction, and a portion of the plurality of first exhaust holes may be formed at different heights in a vertical direction.

The baffle may be connected to the chamber to extend in a horizontal direction, and the top surface of the baffle may include inclined portions formed at both sides of the baffle and inclined downward in an outside direction of the chamber and a horizontal portion formed between the inclined portions.

The inclined portions may be symmetric with respect to the horizontal portion.

The plurality of first exhaust holes may include at least one outside exhaust hole formed in the inclined portions and at least one inside exhaust hole formed in the horizontal portion.

The at least one inside exhaust hole has a diameter less than that of the at least one outside exhaust hole.

The at least one inside exhaust hole may extend in an extension direction of the baffle or a direction horizontally crossing the extension direction of the baffle, and the outside exhaust hole may extend in a direction crossing the extension direction of the inside exhaust hole.

The at least one outside exhaust hole may have a diameter that gradually increases in the outside direction of the chamber.

The inclined portions may include an inductive groove extending in the extension direction of the baffle and recessed downward, and the inductive groove may surround the outside exhaust hole and have a depth and a width, at least one of which gradually increases in the outside direction of the chamber.

The chamber may include second exhaust holes formed at both sides of the baffle to pass through the chamber.

Each of the second exhaust holes may be spaced the same distance from the injection hole, and the spaced distance may be greater than a diameter of the substrate support.

Each of the second exhaust holes may have a diameter greater than that of the first exhaust hole.

The thin film manufacturing apparatus may further include a first exhaust line connected to the baffle and a second exhaust line connected to the second exhaust hole, and the first exhaust line and the second exhaust line may be connected to one trap.

The thin film manufacturing apparatus may further include a valve formed on at least one of the first exhaust line and the second exhaust line.

The baffle may be connected to the chamber in a replaceable manner.

A thin film manufacturing apparatus includes: a chamber having an inner process space of a substrate and including an injection hole for injecting radicals to the process space and an exhaust hole for discharging the radicals; a substrate support unit connected to the chamber to support the substrate in the chamber; a heat source unit connected to the chamber and disposed opposite to the substrate support unit; and a plasma generation unit connected to one side of the chamber to supply the radicals between the substrate support unit and the heat source unit. Here, the injection hole is formed at one side of the chamber, a plurality of exhaust holes are formed at the other side of the chamber, exhaust lines are connected to the plurality of exhaust holes, respectively, and a valve is installed on each of the exhaust lines.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
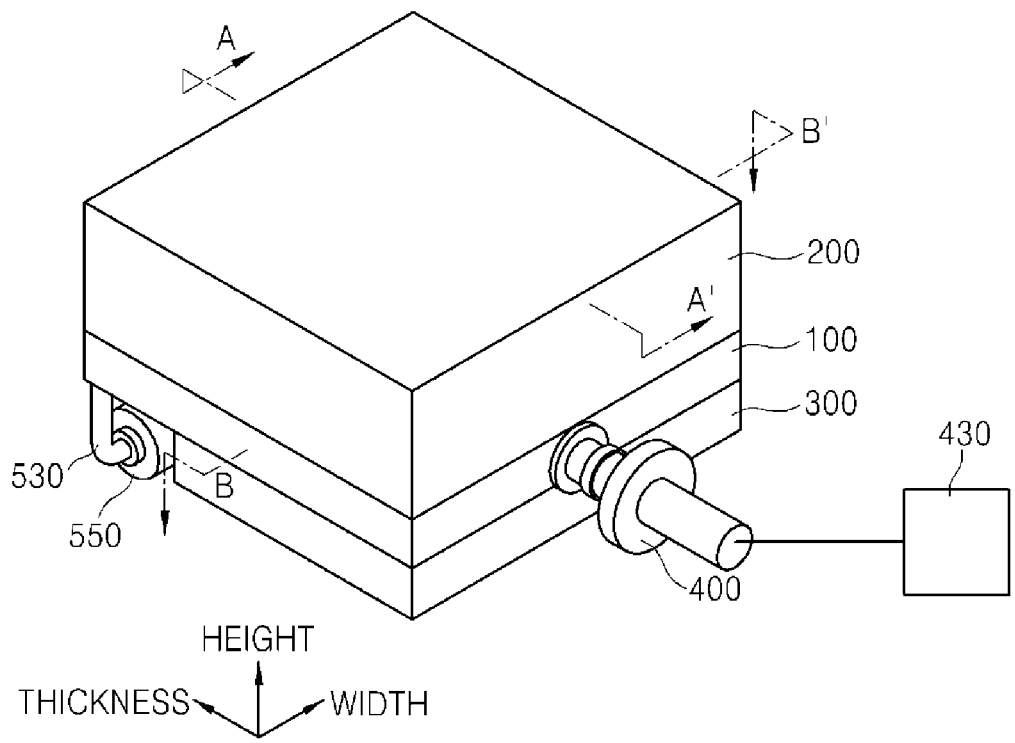
FIG. 1 is a schematic perspective view illustrating a thin film manufacturing apparatus in accordance with an exemplary embodiment.

Hereinafter, specific embodiments will be described in detail with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art. In the figures, like reference numerals refer to like elements throughout.

Figure 2:
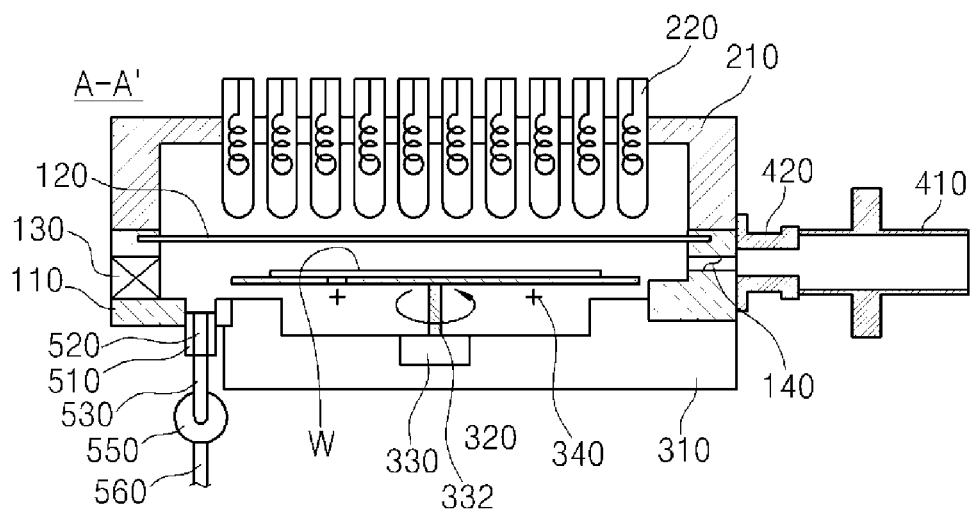
FIG. 2 is a cross-sectional view illustrating the thin film manufacturing apparatus taken along line A-A' of FIG. 1.
Figure 3:
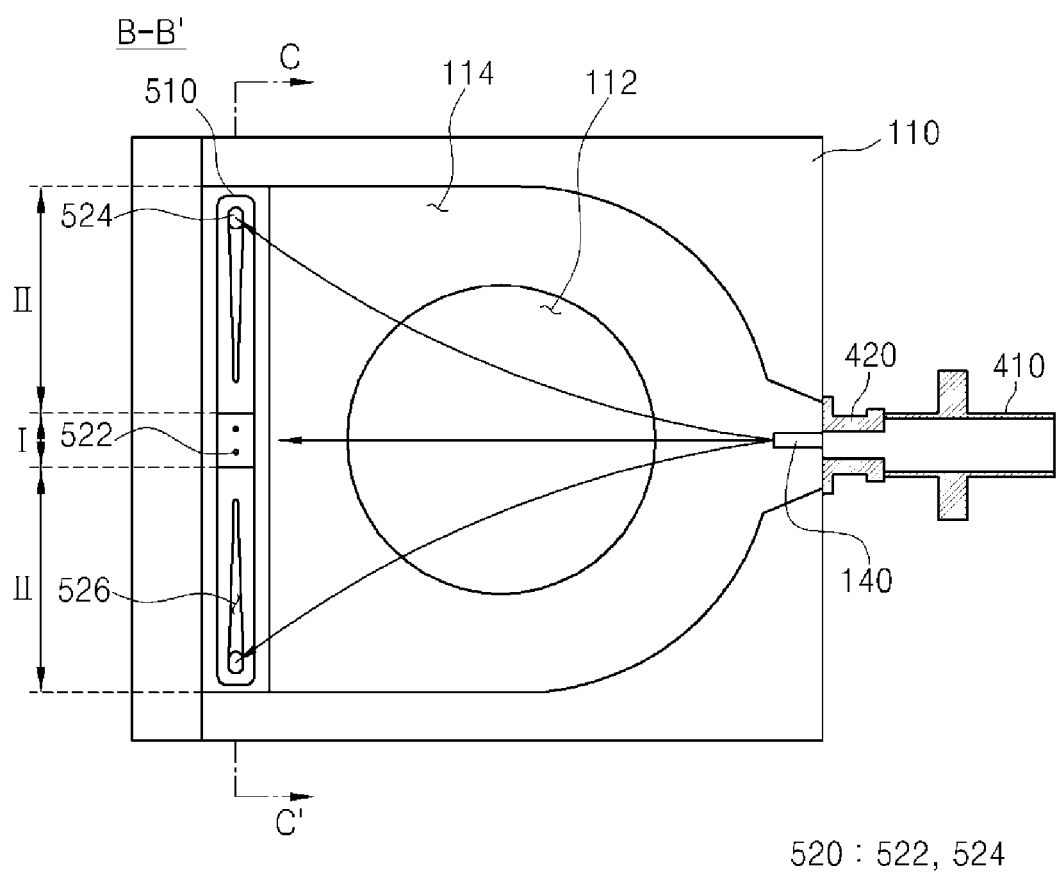
FIG. 3 is a cross-sectional view illustrating the thin film manufacturing apparatus taken along line B-B' of FIG. 1.
Figure 4:
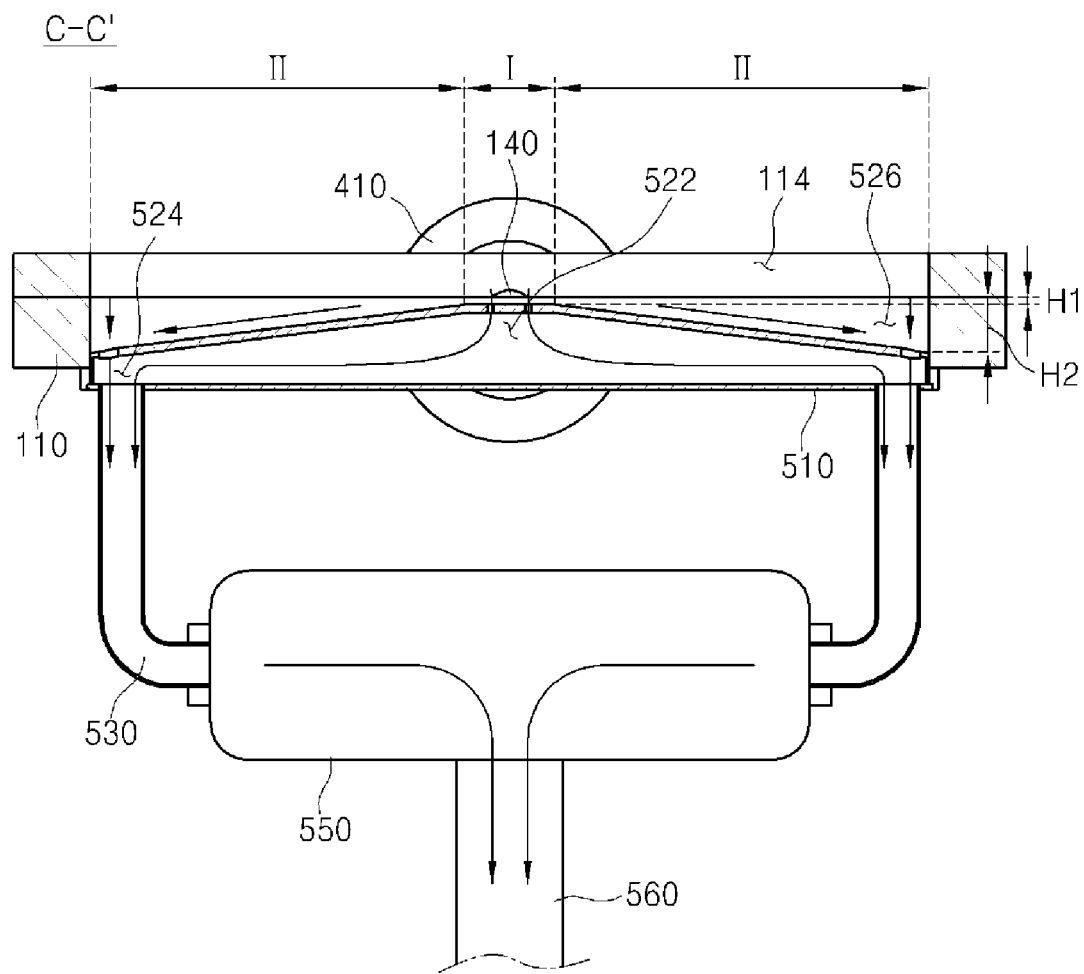
FIG. 4 is a schematic perspective view illustrating a main structure of the thin film manufacturing apparatus in accordance with an exemplary embodiment.

FIG. 1 is a schematic perspective view illustrating a thin film manufacturing apparatus in accordance with an exemplary embodiment, FIG. 2 is a cross-sectional view illustrating the thin film manufacturing apparatus taken along line A-A' of FIG. 1, FIG. 3 is a cross-sectional view illustrating the thin film manufacturing apparatus taken along line B-B' of FIG. 1, and FIG. 4 is a schematic perspective view illustrating a main structure of the thin film manufacturing apparatus in accordance with an exemplary embodiment.

Referring to FIGS. 1 and 2, the thin film manufacturing apparatus in accordance with an exemplary embodiment may include a chamber 100 having an inner process space of a substrate W, a substrate support unit 300 connected to the chamber 100 to support the substrate W in the chamber 100, a heat source unit 200 connected to the chamber 100 to face the substrate support unit 300, a plasma generation unit 400 connected to the chamber 100 to supply radicals between the substrate support unit 300 and the heat source unit 200, and a baffle 510 having an inner movement passage of radicals and including a plurality of first exhaust holes 520 communicating the movement passage and formed in an upper surface thereof. Here, the heat source unit 200 may be installed on the chamber 100, and the substrate support unit 300 may be installed below the chamber 100. Here, the thin film manufacturing apparatus may include a remote plasma oxidation (RPO) device for manufacturing a thermal oxide film by using radicals generated outside the chamber. Here, the RPO device may be manufactured by coupling a remote plasma source installed outside the chamber and a rapid thermal processing device heating a substrate by irradiating the substrate with radiation light emitted from a heat source.

Hereinafter, a direction in which radicals move based on the chamber 100, e.g., a direction in which the radicals are injected into the chamber and discharged, is referred to as a thickness direction, and a direction horizontally crossing the thickness direction is referred to as a width direction. Also, a vertical direction of the chamber 100 is referred to as a height direction.

Referring to FIGS. 2 and 3, the chamber 100 may include a chamber body 110 having an approximately rectangular frame shape having opened upper and lower portions and a transmission window 120 connected to an upper portion of the chamber body 110.

The chamber body 110 may be manufactured into one integrated body or has an assembly body in which various components are connected or coupled. In this case, a sealing unit (not shown) may be additionally provided on a connected portion between the components. Thus, when the substrate W is heated or cooled, energy inputted into the apparatus may be reduced. A gate 130 for loading and unloading the substrate W may be formed in the chamber body 110, and an injection hole 140 for injecting the radical for manufacturing the thin film may be formed in the chamber body 110. Referring to FIG. 2, the gate 130 and the injection hole 140 may face each other in a width direction of the chamber body 110 or may be formed in the same direction, e.g., formed at one side of the chamber body 110 while being spaced apart from each other.

The transmission window 120 may be connected to the upper portion of the chamber body 110 to seal the inside of the chamber body 110. The transmission window 120 may transmit the radiation light emitted from the heat source of the heat source unit 200 disposed on the chamber 100 and be made of a high temperature resistible transparent material such as quartz and sapphire.

The chamber 100 may have a hollow shape having a width, a thickness, and a height to form the inner process space for processing the substrate W. Here, the chamber 100 may have the height less than each of the width and the thickness to form the inner process space that is longer and wider in a horizontal direction than a vertical direction.

Referring to FIG. 3, the injection hole 140 for injecting radicals may be formed at one side of the chamber body 110. Also, a guide groove 114 for guiding a movement direction of the radicals may be formed in the chamber body 110. A through-hole 112 passing a lower portion of the chamber body 110 may be formed in the chamber body 110 so that a substrate support 320 of the substrate support unit 300 is inserted to the chamber body 110. Also, the guide groove 114 may be formed along a circumferential direction of the through-hole 112. Here, the guide groove 114 may form an inner bottom surface of the chamber body 110. The guide groove 114 may be formed in the chamber body 110 in the movement direction of the radicals, e.g., a thickness direction of the chamber body 110. Also, the guide groove 114 may have a shape having a width that gradually increases in the thickness direction of the chamber body 110 at a side at which the injection hole 140 is formed so that the radicals are uniformly diffused toward the process space.

The injection hole 140 may be formed at a position higher than the substrate support 320 of the substrate support unit 300 to supply the radicals toward a central portion of the substrate support 320. This is because the radicals injected to the process space through the injection hole 140 move along a surface of the substrate W to sufficiently contact the substrate W.

Referring to FIG. 3, the baffle 510 may be installed at the other side of the chamber body 110, which faces the injection hole 140, to extend in the horizontal direction. The baffle 510 may be installed to the chamber body 110 to pass through the chamber body 110. Here, the baffle 510 may be installed to be spaced apart from the substrate support 320 in the guide groove 114 formed in the chamber body 110, and disposed at a position lower than a top surface of the substrate support 320. Also, the baffle 510 may be longer than a diameter of the substrate support 320.

The baffle 510 may have a block shape in which a movement passage of the radicals is formed therein, and the plurality of first exhaust holes 520 for discharging radicals may be formed in a top surface of the baffle 510. The baffle 510 may extend in one direction and arranged along the width direction of the chamber 100. Also, the plurality of first exhaust holes 520 may be spaced apart from each other in the horizontal direction, in which the baffle 510 extends, on the top surface of the baffle 510, and a portion of the plurality of first exhaust holes 520 may be formed at different heights in the vertical direction. The plurality of first exhaust holes 520 may communicate with the movement passage formed in the baffle 510.

Referring to FIG. 4, the top surface of the baffle 510 may include inclined portions II formed such that both sides of the top surface are inclined downward in an outside direction of the chamber and a horizontal portion I formed between the inclined portions II. Here, the inclined portions II may be symmetric with respect to the horizontal portion I. Also, the plurality of first exhaust holes 520 may include at least one inside exhaust hole 522 formed in the horizontal portion I and at least one outside exhaust hole 524 formed in the inclined portions II. Here, the one outside exhaust hole 524 formed at an outermost portion of the at least one outside exhaust hole 524 may be formed at a further outer side than the substrate support 320 and have a diameter greater than that of the rest outside exhaust hole 524.

This is for inducing the radicals injected to the process space through the injection hole 140 until an edge side of the process space and diffusing the radicals over the entire process space.

The horizontal portion I may be disposed in an area corresponding to the central portion of the substrate support 320 in the top surface of the baffle 510.

Also, one or a plurality of inside exhaust holes 522 formed in the horizontal portion I may be formed symmetrically with respect to the central portion of the substrate support 320. The inside exhaust hole 522 may have a diameter less than that of the outside exhaust hole 524 formed in the inclined portions II. This is for preventing the radicals injected through the injection hole 140 from flowing to be concentrated on the central portion of the substrate support 320 instead of being sufficiently diffused to the edge of the process space.

The inclined portions II may be symmetrically formed at both sides of the horizontal portion I in the top surface of the baffle 510 and extend to the outside of the substrate support 320. At least one outside exhaust hole 524 may be formed in the inclined portions II. Here, one outside exhaust hole 524 may be formed in each of the inclined portions II. In this case, the outside exhaust hole 524 may be formed at each of both ends of the baffle 510. This is for uniformly diffusing the radicals until both ends of the process space through the injection hole 140.

The baffle 510 may include an inductive groove 526 that is recessed downward. The inductive groove 526 may surround the outside exhaust hole 524 in the inclined portions II to induce the radicals that arrive at the top surface of the baffle 510 toward the outside exhaust hole 524. Here, the inductive groove 526 may have a shape having a depth or a width that gradually increases in a direction toward both the ends of the baffle 510 to smoothly induce the radicals toward the outside exhaust hole 524.

Figure 5:
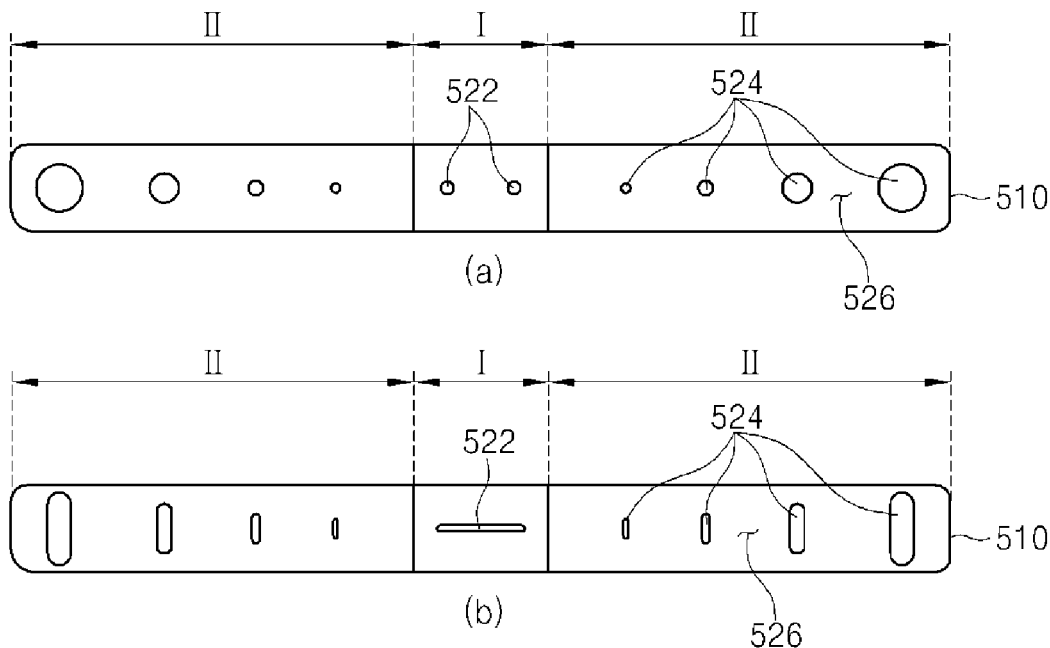
FIG. 5 is a view illustrating various shapes of an exhaust hole formed in a baffle.

FIG. 5 is a view illustrating various shapes of the first exhaust hole formed in the baffle.

(a) of FIG. 5 is a view illustrating an example of forming two inside exhaust holes 522 in the horizontal portion I of the baffle 510 and forming four outside exhaust holes 524 that are spaced apart from each other in the horizontal direction in each of the inclined portions II. In this case, each of the inside exhaust hole 522 and the outside exhaust hole 524 may have a circular shape, and the outside exhaust hole 524 may have a diameter that gradually increases in a direction toward both the ends of the baffle 510.

(b) of FIG. 5 is a view illustrating an example of forming one inside exhaust hole 522 in the horizontal portion I and forming four outside exhaust holes 524 that are spaced apart from each other in the horizontal direction in each of the inclined portions II. Here, each of the inside exhaust hole 522 and the outside exhaust hole 524 may have a thin and long elliptical shape, and the inside exhaust hole 522 and the outside exhaust hole 524 may extend in different directions. In this case, the inside exhaust hole 522 may extend lengthily in an extension direction of the baffle 510, and the outside exhaust hole 524 may extend lengthily in a direction crossing the inside exhaust hole 522. Also, the outside exhaust hole 524 may have a diameter or an opening that gradually increases in a direction toward both the ends of the baffle 510.

Although the example of forming one or two inside exhaust holes 522 in the horizontal portion I, and four outside exhaust holes 524 in each of the inclined portions II is described, the exemplary embodiment is not limited to the number of each of the inside exhaust hole 522 and the outside exhaust hole 524. For example, the number of each of the inside exhaust holes 522 and the outside exhaust hole 524 may be variously changed. Also, the exemplary embodiment is not limited to the shape of each of the inside exhaust hole 522 and the outside exhaust hole 524. For example, the shape of each of the inside exhaust hole 522 and the outside exhaust hole 524 may be variously changed.

As the baffle 510 adjusts a movement direction, a movement distance, and a retention time of the radicals in the process space through the above-described configuration, the radicals may uniformly contact the substrate W.

Referring to FIG. 4 again, the inside exhaust hole 522 and the outside exhaust hole 524 formed in the baffle 510 may be formed at different heights in the vertical direction. That is, the top surface of the baffle 510 in which the inside exhaust hole 522 and the outside exhaust hole 524 are formed may include the horizontal portion I and the inclined portions II. Thus, the inside exhaust holes 522 formed in the horizontal portion I and the outside exhaust hole 524 formed in the inclined portions II may be formed at different heights in the vertical direction, and the inside exhaust hole 522 may be formed at a position higher than the outside exhaust hole 524. Also, when a plurality of outside exhaust holes 524 are formed in the inclined portions II, the plurality of outside exhaust holes 524 may be formed at different heights that gradually decrease in directions toward both the ends of the baffle 510. Here, based on an inner bottom surface of the chamber 100, a distance H1 between the inside exhaust hole 522 and the inner bottom surface of the chamber 100 may be less than a distance H2 between the outside exhaust hole 524 and the inner bottom surface of the chamber 100.

When the inside exhaust hole 522 and the outside exhaust hole 524 are formed at different heights as described above, the movement direction, the movement distance, and the retention time of the radicals in the process space may be locally adjusted. Based on the injection hole 140, distances from the injection hole 140 to the inside exhaust hole 522 and the outside exhaust hole 524 are different from each other. Alternatively, the radicals injected from one side of the chamber 100 to the process space may horizontally move to the other side of the chamber and then be discharged through the first exhaust hole 520. Here, the radicals that horizontally move to the other side of the chamber 100 move in the vertical direction to be introduced to the baffle 510 installed at a position lower than the inner bottom surface of the chamber 100. In this case, the movement distance of the radicals in the vertical direction may be varied according to a height at which the first exhaust hole 520, i.e., the inside exhaust hole 522 and the outside exhaust hole 524, is formed. In other words, since each of the distances from the inner bottom surface of the chamber 100 to the inside exhaust hole 522 and the outside exhaust hole 524 is long, the movement distance of the radicals at a side at which the outside exhaust hole 524 is formed increases. Thus, the retention time of the radicals may increase at the edge of the substrate support 320 more than the central portion of the substrate support 320 at which the inside exhaust hole 522 is formed. Also, since a portion of the radicals that move to an upper portion of the baffle 510 may move along the inclined portions II of the baffle 510 or the inductive groove 526 formed in the inclined portions II and be discharged to the outside exhaust hole 524, the movement distance of the radicals may further effectively increase. The retention time of the radicals in the process space may be locally adjusted by adjusting the movement distance of the radicals in the process space. Through this, the radicals may uniformly contact the entire substrate W, and a thin film having excellent uniformity may be formed on the substrate W.

A first exhaust line 530 for discharging the radicals introduced to the movement passage in the baffle 510 through the first exhaust hole 520 may be connected to the baffle 510. Here, the first exhaust line 530 may be connected to each of both sides in the extension direction of the baffle 510 to communicate with the movement passage, thereby adjusting a movement speed of the radicals in the process space. That is, the first exhaust line 530 may be connected to the baffle 510 so as to be disposed adjacent to the outside exhaust hole 524 and prevent the radicals from being quickly discharged through the inside exhaust hole 522. Also, the first exhaust line 530 may be connected to a trap 550, and an exhaust pipe 560 on which a pump (not shown) is installed may be connected to the trap 550. Through the above-described configuration, the baffle 510 may discharge gases and the radicals in the chamber 100 and also perform pressure control such as vacuum formation in the chamber 100.

A plurality of baffles 510 may be manufactured by variously forming sizes or shapes of the first exhaust hole 520 and appropriately replaced according to uniformity of the thin film formed on the substrate W or a process condition.

Referring to FIG. 2, the heat source unit 200 may be installed on the chamber 100 to heat the substrate W loaded into the chamber 100. The heat source unit 200 may include a hollow support body 210 having an opened lower portion and a heat source 220 installed in the support body 210.

The support body 210 may have an area similar to that of the chamber 100 or the inner process space of the chamber 100 and have an opened lower portion so that the radiation light emitted from the heat source 220 is transmitted toward the chamber 100. Here, a concave and convex structure (not shown) such as a recessed groove or a reflection film (not shown) may be formed in the support body 210 to reflect the radiation light emitted from the heat source 220 toward the chamber 100. The support body 210 may include a flow path (not shown) for circulating a cooling medium to prevent over-heating by the radiation light emitted from the heat source 220.

The heat source 220 may include a lamp capable of emitting the radiation light such as a tungsten halogen lamp, a carbon lamp, and a ruby lamp and have various shapes such as a linear shape or a bulb shape.

The substrate support unit 300 may be installed below the chamber 100 so as to be disposed opposite to the heat source unit 200. The substrate support unit 300 may include a substrate support 320 for supporting the substrate W thereon and a driver 330 for rotating the substrate support 320. Also, the substrate support unit 300 may further include a lift member 340 for transferring the substrate W in the vertical direction and a temperature measuring unit (not shown) for measuring a temperature of the substrate W. The substrate support unit 300 may include a separate housing 310 and be coupled to a lower portion of the chamber 100 to seal the inside of the chamber 100.

The substrate support 320 may be disposed in the through-hole 112 formed in the chamber body 110. The substrate support 320 may include, e.g., an electrostatic chuck to absorb and maintain the substrate W by using an electrostatic force so that the substrate W is seated and supported. Alternatively, the substrate support 320 may support the substrate W through vacuum adsorption or a mechanical force. The substrate support 320 may have a shape corresponding to that of the substrate W, e.g., a circular shape, and have a size greater than that of the substrate W.

The driver 330 may be connected to a lower portion of the substrate support 320 through a rotational shaft 332 and rotate the substrate W when the thin film is formed on the substrate W.

The plasma generation unit 400 may include a process gas supplier 430, a plasma generator 410 for generating plasma by receiving a power from the outside and activating a process gas supplied from the process gas supplier 430, and a waveguide 420 for connecting the plasma generator 410 and the chamber 100 to supply the radicals into the chamber 100. Also, the plasma generation unit 400 may include a flow rate regulator (not shown) installed on the waveguide 420 to adjust a flow rate of the radicals supplied to the injection hole 140. The plasma generation unit 400 maybe connected to one side of the chamber body 110 to supply the radicals between the heat source unit 200 and the substrate support 320.

The plasma generation unit 400 may include a heating member (not shown) for adjusting a temperature of the waveguide 420 to maintain a constant temperature of the radicals supplied from the plasma generator 410 to the chamber 100. That is, the radicals generated from the plasma generator 410 may move along the waveguide 420 and be supplied into the chamber 100. In this case, when the temperature of the radicals decreases in the waveguide 420, the radicals may be coupled with each other and converted into a gas state. Thus, the temperature of the radicals may be constantly maintained by installing the heating member (not shown) on the waveguide 420.

The process gas supplier 430 may supply a gas for manufacturing a thin film to the plasma generator 410. The process gas supplier 430 may supply various gases such as $O_2$, $N_2$, $H_2$, $N_2O$, and $NH_3$ according to the kind of the thin film to be manufactured. Here, an example of supplying $O_2$ to the plasma generator 410 from the process gas supplier 430 to form an oxide film on the substrate W will be described. The process gas supplier 430 may supply the process gas to the plasma generator 410.

Hereinafter, a thin film manufacturing apparatus in accordance with another exemplary embodiment will be described.

Figure 6:
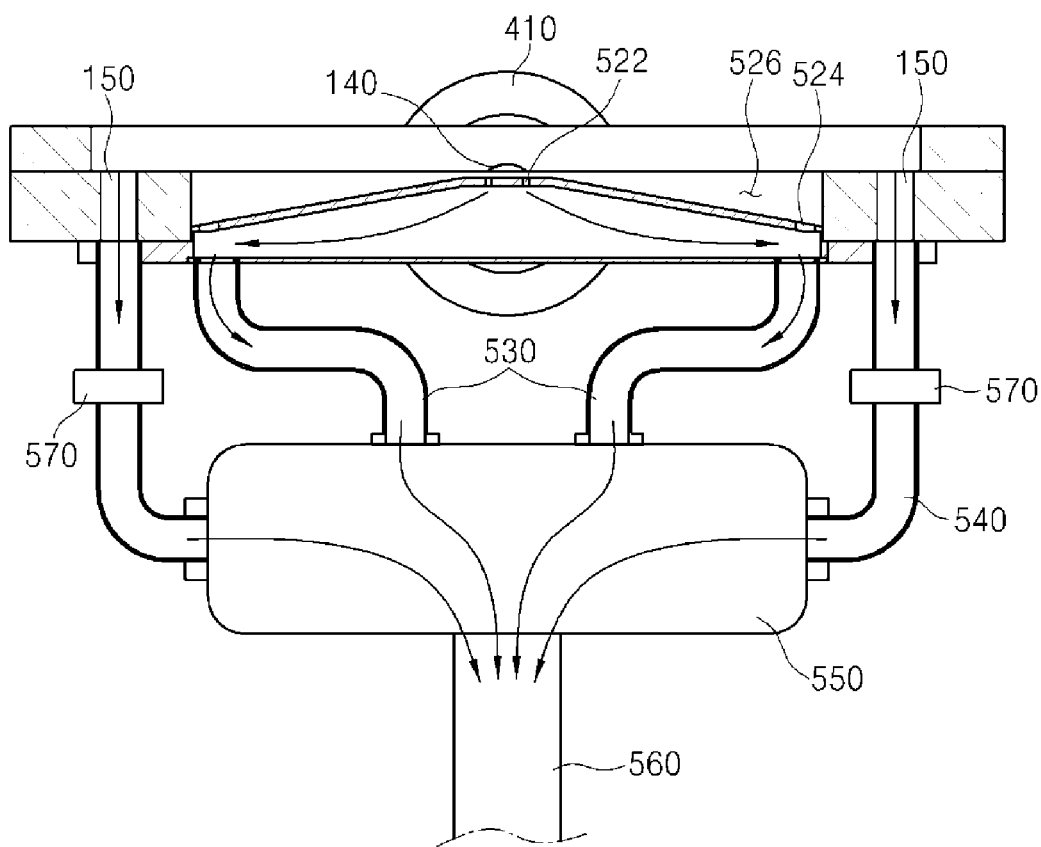
FIG. 6 is a schematic cross-sectional view illustrating a chamber of a thin film manufacturing apparatus in accordance with another exemplary embodiment.

FIG. 6 is a schematic cross-sectional view illustrating a chamber of the thin film manufacturing apparatus in accordance with another exemplary embodiment.

The thin film manufacturing apparatus in accordance with another exemplary embodiment has an almost similar configuration to the above-described thin film manufacturing apparatus in accordance with an exemplary embodiment except for a component for discharging the radicals injected to the inner process space of the chamber 100. Thus, components overlapped with those of an exemplary embodiment will not be described.

An injection hole 140 for injecting radicals may be formed at one side of a chamber body 110, and a second exhaust hole 150 for discharging the radicals may be formed at the other side of the chamber body 110. Here, the second exhaust hole 150 may be formed at each of both sides of a baffle 510. The baffle 510 may have a length similar to a diameter of a substrate support 320 and formed on the chamber body 110 to be disposed outside the substrate support 320.

The second exhaust hole 150 may have a shape allowing the chamber body 110 to vertically pass through a guide groove 114 in the chamber body 110. In addition, the second exhaust hole 150 may have various shapes.

The second exhaust hole 150 may have a diameter greater than that of a first exhaust hole 520 formed in the baffle 510. This is for sufficiently diffusing the radicals introduced to a process space until an edge of the process space.

A second exhaust line 540 may be connected to the second exhaust hole 150. Here, a second exhaust line 540 may be connected to the same trap 560 as a first exhaust line 530 connected to the baffle 510. In this case, a valve 570 may be installed on at least one of the first exhaust line 530 and the second exhaust line 540 to control an amount of the radicals discharged through the first exhaust line 530 and the second exhaust line 540.

For example, a thin film may be formed on the substrate W, uniformity of the formed thin film may be measured, and the amount of the radicals discharged through the first exhaust line 530 and the second exhaust line 540 may be adjusted in a following process. In this case, when the thin film formed on a central portion of the substrate W is less than a preset target thickness, it may be determined that a movement direction of the radicals is biased to the second exhaust hole 150. Thus, the amount of the radicals moving toward the second exhaust hole 150 may decrease by reducing an opening degree of the second exhaust line 540, or the amount of the radicals moving toward the first exhaust hole 520 may increase by allowing an opening degree of the first exhaust line 530 to increase.

Although a movement direction, a movement distance, and a retention time of the radicals in the process space are adjusted by installing the baffle 510 on the chamber 100 herein, the movement direction, the movement distance, and the retention time of the radicals in the process space may be adjusted by changing the number and the size of the second exhaust hole 150 formed in the chamber 100. In this case, although not shown, four second exhaust holes, which are spaced apart from each other, may be formed at the other side of the chamber body, and the second exhaust line may be connected to each of the second exhaust holes. In this case, the four second exhaust holes may be arranged in a row, or at least two second exhaust holes may be arranged in a row. Also, a valve may be installed on each of the second exhaust lines, and the movement distance, and the retention time of the radicals in the process space may be adjusted by adjusting the opening degree of the second exhaust line.

The thin film manufacturing apparatus in accordance with the exemplary embodiments may control the flow of the radicals in the process space of the substrate to improve the uniformity of the thin film. That is, the radicals may be uniformly diffused over the entire process space of the substrate by controlling the shape and the position of the exhaust hole through which the radicals are discharged. Thus, the thin film may be uniformly formed over the entire substrate by allowing the radicals to uniformly contact the substrate in the process space of the substrate. Also, the deformation of the substrate caused by the thermal stress may be minimized in the process of forming the thin film. Thus, the process yield and the productivity may be improved.

Although the present invention has been described with reference to the specific embodiments, it is not limited thereto, and the scope of the present invention is defined by the appended claims. Thus, it is obvious to those skilled in the art that the various changes and modifications can be made in the technical spirit of the present invention.

What is claimed is:

1. A thin film manufacturing apparatus comprising:
a chamber having an inner process space of a substrate;
a substrate support unit connected to the chamber to support the substrate in the chamber;
a heat source unit connected to the chamber and disposed opposite to the substrate support unit;
a plasma generation unit connected to one side of the chamber to supply radicals between the substrate support unit and the heat source unit; and
a baffle connected to the chamber and comprising a movement passage of the radicals therein and a plurality of first exhaust holes communicating with the movement passage, which are formed in a top surface thereof,
wherein the process space is formed to have a height less than each of a width and a thickness thereof,
the chamber comprises an injection hole formed at one side of the chamber in the thickness direction to inject the radicals from the plasma generation unit into the process space,
the baffle is disposed at the other side of the chamber in the thickness direction to extend in the width direction,
the plurality of first exhaust holes are spaced apart from each other, and
a portion of the plurality of first exhaust holes are formed at different heights in the height direction.

2. The thin film manufacturing apparatus of claim 1, wherein the substrate support unit comprises a substrate support that is rotatable and installed in the chamber, and
the baffle is connected to the chamber so that a top surface of the baffle is disposed at a position lower than a top surface of the substrate seated on the substrate support.

3. The thin film manufacturing apparatus of claim 2, wherein the baffle is connected to the chamber to extend in a horizontal direction, and
the top surface of the baffle comprises inclined portions formed at both sides of the baffle in the width direction and inclined downward in an outside direction of the chamber and a horizontal portion formed between the inclined portions.

4. The thin film manufacturing apparatus of claim 3, wherein the inclined portions are symmetric with respect to the horizontal portion.

5. The thin film manufacturing apparatus of claim 4, wherein the plurality of first exhaust holes comprise at least one outside exhaust hole formed in the inclined portions and at least one inside exhaust hole formed in the horizontal portion.

6. The thin film manufacturing apparatus of claim 5, wherein the at least one inside exhaust hole has a diameter less than that of the at least one outside exhaust hole.

7. The thin film manufacturing apparatus of claim 5, wherein the at least one inside exhaust hole extends in the width direction or the thickness direction, and
the outside exhaust hole extends in a direction crossing the extension direction of the inside exhaust hole.

8. The thin film manufacturing apparatus of claim 5, wherein the at least one outside exhaust hole has a diameter that gradually increases in the outside direction of the chamber.

9. The thin film manufacturing apparatus of claim 5, wherein the inclined portions comprise an inductive groove extending in the width direction of the baffle and recessed downward, and
the inductive groove surrounds the outside exhaust hole and has a depth and a width, at least one of which gradually increases in the outside direction of the chamber.

10. The thin film manufacturing apparatus of claim 2, wherein the chamber comprises second exhaust holes formed at both sides of the baffle in the width direction to pass through the chamber.

11. The thin film manufacturing apparatus of claim 10, wherein each of the second exhaust holes is spaced the same distance from the injection hole, and
the spaced distance is grater than a diameter of the substrate support.

12. The thin film manufacturing apparatus of claim 10, wherein each of the second exhaust holes has a diameter greater than that of the first exhaust hole.

13. The thin film manufacturing apparatus of claim 10, further comprising a first exhaust line connected to the baffle and a second exhaust line connected to the second exhaust hole, and
the first exhaust line and the second exhaust line are connected to one trap.

14. The thin film manufacturing apparatus of claim 13, further comprising a valve formed on at least one of the first exhaust line and the second exhaust line.

15. The thin film manufacturing apparatus of claim 10, wherein the baffle is connected to the chamber in a replaceable manner.

16. A thin film manufacturing apparatus comprising:
a chamber having an inner process space of a substrate and comprising an injection hole for injecting radicals to the process space and an exhaust hole for discharging the radicals;
a substrate support unit connected to the chamber to support the substrate in the chamber;
a heat source unit connected to the chamber and disposed opposite to the substrate support unit; and
a plasma generation unit connected to the injection hole of the chamber to supply the radicals between the substrate support unit and the heat source unit; and
a baffle connected to the chamber and comprising a movement passage of the radicals therein and a plurality of first exhaust holes communicating with the movement passage, which are formed in a top surface thereof,
wherein the process space is formed to have a height less than each of a width and a thickness thereof,
wherein the injection hole is formed at one side of the chamber in the thickness direction,
wherein the baffle is disposed at the other side of the chamber in the thickness direction to extend in the width direction,
wherein the exhaust holes are plural and formed at the other side of the chamber in the thickness direction to be provided at both sides of the baffle in the width direction, respectively,
wherein the plurality of first exhaust holes are spaced apart from each other,
wherein a portion of the plurality of first exhaust holes are formed at different heights in the height direction, and
wherein exhaust lines are connected to the plurality of exhaust holes, respectively, and a valve is installed on each of the exhaust lines.

* * * * *